(12) United States Patent
Saggio et al.

(10) Patent No.: US 12,249,634 B2
(45) Date of Patent: Mar. 11, 2025

(54) VERTICAL-CONDUCTION SILICON CARBIDE MOSFET DEVICE HAVING IMPROVED GATE BIASING STRUCTURE AND MANUFACTURING PROCESS THEREOF

(71) Applicant: STMICROELECTRONICS S.r.l., Agrate Brianza (IT)

(72) Inventors: Mario Giuseppe Saggio, Aci Bonaccorsi (IT); Alfio Guarnera, Trecastagni (IT); Cateno Marco Camalleri, Catania (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 530 days.

(21) Appl. No.: 17/669,239

(22) Filed: Feb. 10, 2022

(65) Prior Publication Data
US 2022/0262913 A1 Aug. 18, 2022

(30) Foreign Application Priority Data
Feb. 17, 2021 (IT) .......................... 102021000003653

(51) Int. Cl.
*H01L 29/423* (2006.01)
*H01L 29/16* (2006.01)
(Continued)

(52) U.S. Cl.
CPC .... *H01L 29/42376* (2013.01); *H01L 29/1608* (2013.01); *H01L 29/401* (2013.01);
(Continued)

(58) Field of Classification Search
CPC .......... H01L 29/42376; H01L 29/1608; H01L 29/401; H01L 29/435; H01L 29/66068;
(Continued)

(56) References Cited

U.S. PATENT DOCUMENTS 8,969,929 B2 * 3/2015 Sakanishi ............. H01L 29/495
257/287
10,090,379 B2 * 10/2018 Harada ................... H01L 29/78
(Continued)

FOREIGN PATENT DOCUMENTS

WO WO 2012001837 A1 1/2012

*Primary Examiner* — Allison Bernstein
(74) *Attorney, Agent, or Firm* — SEED IP LAW GROUP LLP

(57) ABSTRACT

A vertical-conduction MOSFET device formed in a body of silicon carbide having a first and a second face and a peripheral zone. A drain region, of a first conductivity type, extends in the body between the two faces. A body region, of a second conductivity type, extends in the body from the first face, and a source region, having the first conductivity type, extends to the inside of the body region from the first face of the body. An insulated gate region extends on the first face of the body and comprises a gate conductive region. An annular connection region, of conductive material, is formed within a surface edge structure extending on the first face of the body, in the peripheral zone. The gate conductive region and the annular connection region are formed by a silicon layer and by a metal silicide layer overlying the silicon layer.

20 Claims, 8 Drawing Sheets

(51) Int. Cl.
*H01L 29/40* (2006.01)
*H01L 29/43* (2006.01)
*H01L 29/66* (2006.01)
*H01L 29/78* (2006.01)

(52) U.S. Cl.
CPC ...... *H01L 29/435* (2013.01); *H01L 29/66068* (2013.01); *H01L 29/7827* (2013.01)

(58) Field of Classification Search
CPC ........... H01L 29/7827; H01L 29/42372; H01L 29/0696; H01L 29/4238; H01L 29/4933; H01L 29/7802; H01L 29/66666
See application file for complete search history.

(56) References Cited

U.S. PATENT DOCUMENTS

| | | | |
|---|---|---|---|
| 11,069,771 B2* | 7/2021 | Nakagawa | H01L 29/42376 |
| 2009/0212355 A1 | 8/2009 | Hsu | |
| 2010/0244048 A1 | 9/2010 | Hayashi et al. | |
| 2012/0205670 A1 | 8/2012 | Kudou et al. | |
| 2012/0319134 A1 | 12/2012 | Honaga et al. | |
| 2019/0013311 A1 | 1/2019 | Losee et al. | |
| 2021/0343708 A1* | 11/2021 | Lichtenwalner | H01L 29/4238 |
| 2023/0092171 A1* | 3/2023 | Ogata | H01L 29/7806 257/77 |
| 2024/0014286 A1* | 1/2024 | Saggio | H01L 29/4983 |

* cited by examiner

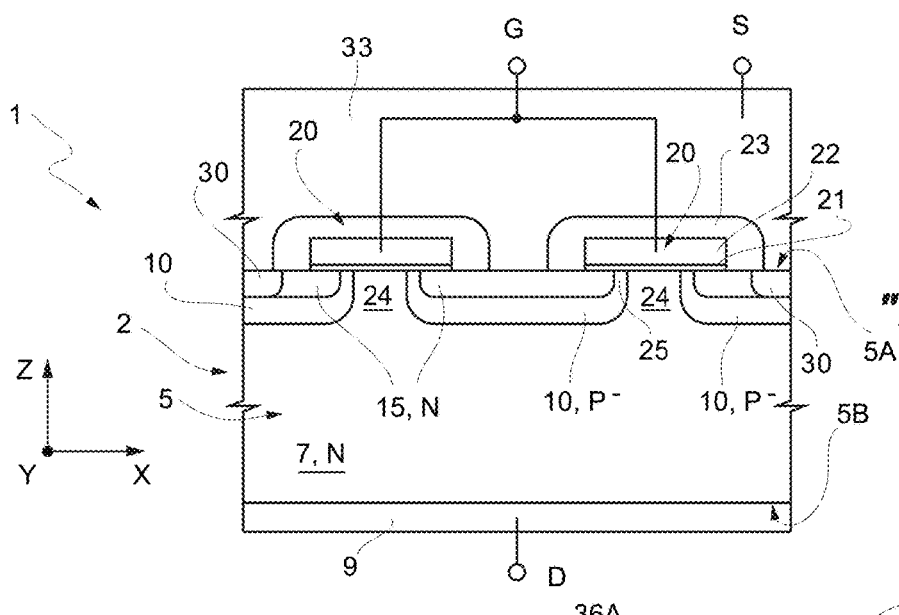
FIG. 1 *"Prior Art"*
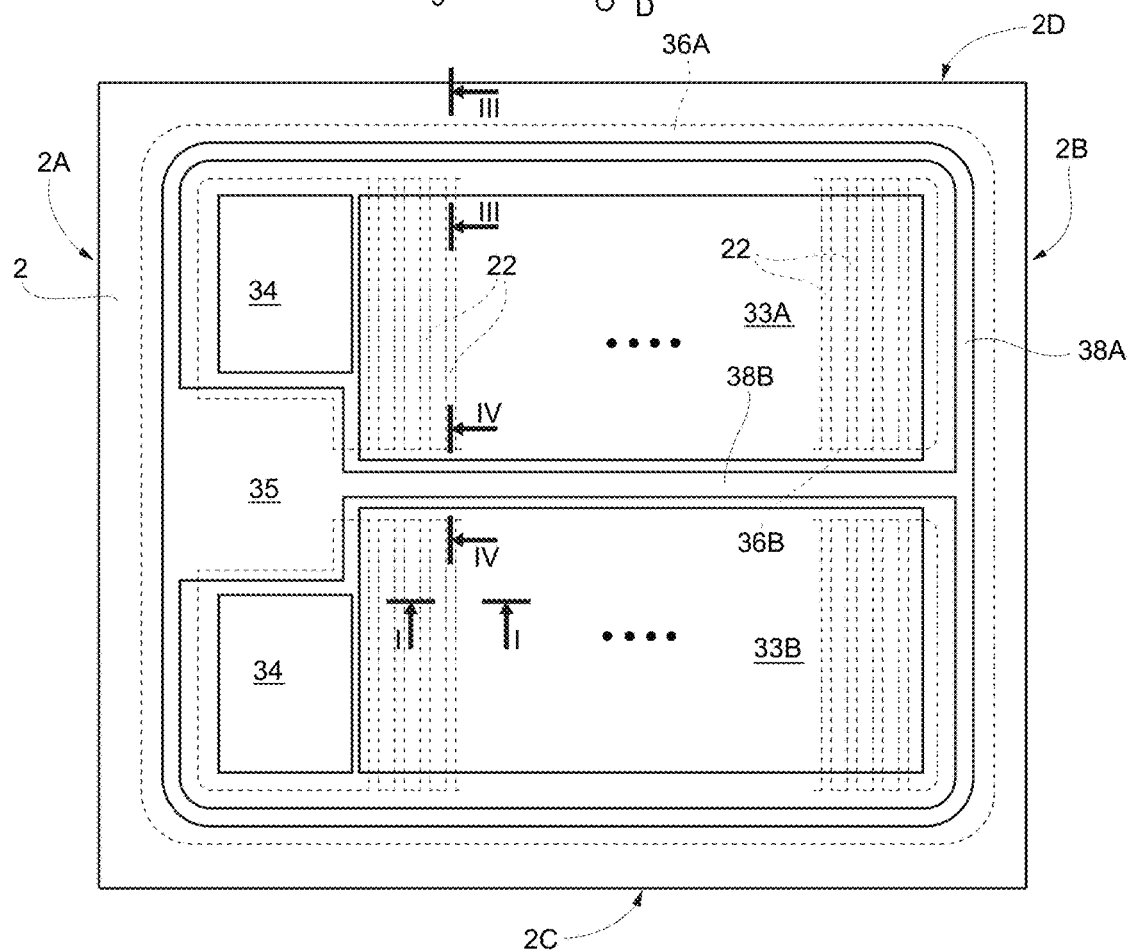
FIG. 2 *"Prior Art"*

VERTICAL-CONDUCTION SILICON CARBIDE MOSFET DEVICE HAVING IMPROVED GATE BIASING STRUCTURE AND MANUFACTURING PROCESS THEREOF

BACKGROUND

Technical Field

The present disclosure relates to a vertical-conduction silicon carbide MOSFET device having improved gate biasing structure and to the manufacturing process thereof.

Description of the Related Art

As known, semiconductor materials having a wide bandgap, for example higher than 1.1 eV, low on-resistance, high thermal conductivity, high operating frequency and high saturation velocity of the charge carriers allow to obtain electronic devices, for example diodes and transistors, having better performance than electronic devices formed in a silicon substrate. This applies specifically to power applications, for example in devices operating at voltages comprised between 600 V and 1300 V or in specific operating conditions, such as high temperature.

In particular, MOSFET electronic devices are formed starting from a wafer of silicon carbide in one of its polytypes, for example 3C—SiC, 4H—SiC and 6H—SiC, which provide the above listed advantages. In particular, in the following description, reference will be made to the 4H—SiC polytype, but what will be said also applies to the other polytypes, without limiting the scope.

BRIEF SUMMARY

The present disclosure overcomes the drawbacks of the prior art.

According to the present disclosure a vertical-conduction MOSFET device and the manufacturing process thereof are provided.

A structure includes: a semiconductor body of a first conductivity type, the semiconductor body having a first surface and second surface opposite to the first surface; a body region of a second conductivity type extending from the first surface of the semiconductor body into the semiconductor body; a current conduction region of the first conductivity type, extending from the first surface of the semiconductor body into the body region; a gate region, extending on the first surface of the body and overlying a portion of the body region laterally that is between the semiconductor body and the current conduction region; and a surface edge structure, extending on a portion of the first surface outside the gate region and including a conductive structure.

BRIEF DESCRIPTION OF THE SEVERAL VIEWS OF THE DRAWINGS

For a better understanding of the present disclosure some embodiments thereof are now described, purely by way of non-limiting example, with reference to the attached drawings, wherein:

FIG. 1 is a cross-section through a portion of an example MOSFET device, taken along section line I-I of FIG. 2;

FIG. 2 is a top plan view of the MOSFET device of FIG. 1;

DETAILED DESCRIPTION

Figure 3:
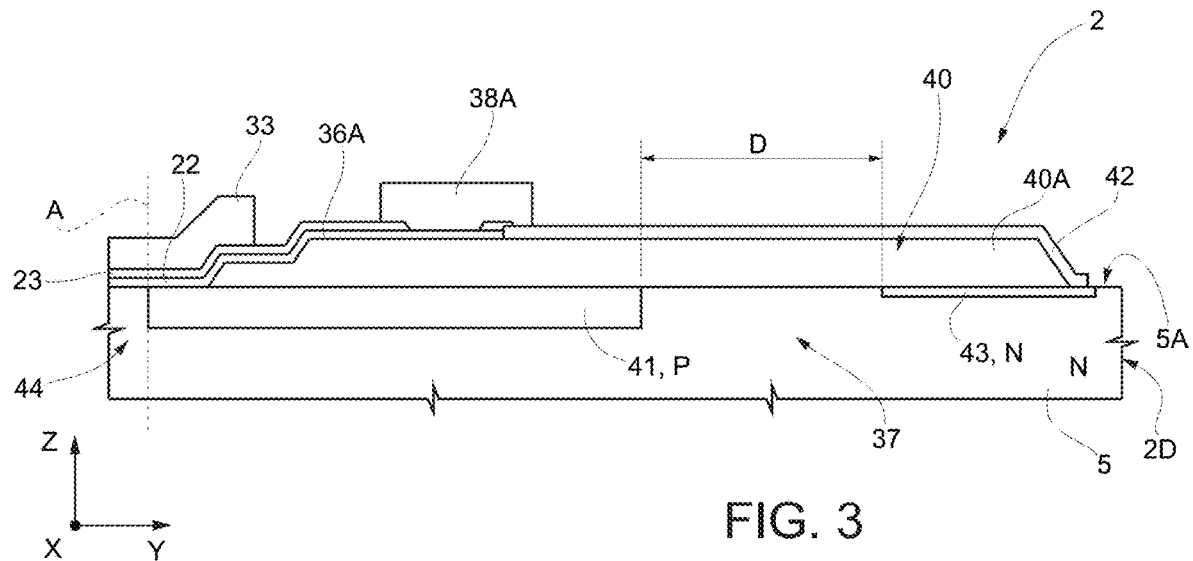
FIG. 3 is a cross-section through the MOSFET device of FIG. 1, taken along section line of FIG. 2.

For instance, FIG. 1 is a cross-section through a known vertical-conduction MOSFET device 1, in a Cartesian reference system XYZ comprising a first axis X, a second axis Y, and a third axis Z.

The MOSFET device 1 is formed by a plurality of elementary cells, only two of which are shown here, which have equal structure, are arranged adjacent in a same die 2 and are connected together in parallel. They consequently share a source terminal S, a drain terminal D, and a gate terminal G.

The die 2 comprises a substrate 5 of silicon carbide, having a first surface 5A and a second surface 5B. The substrate 5 accommodates a drain region 7, a plurality of body regions 10, and a plurality of source regions 15.

The drain region 7, here of an N type, extends between the first and the second surface 5A, 5B of the substrate 5. A drain contact region 9, of conductive material such as metal or silicide, extends on the second surface 5B of the substrate 5, in direct electrical contact with the drain region 7, and forms the drain terminal D of the MOSFET device 1.

The body regions 10 are of P type and extend in the substrate 5, at a distance from each other, from the first surface 5A.

A superficial portion 24 of the drain region 7 is comprised between two adjacent body regions 10.

The body regions 10 further extend along the second axis Y and have here, in top view, the shape of strips.

The source regions 15 extend each, from the first surface 5A of the substrate 5, within a respective body region 10 and are of N type. Each source region 15 has a width, along the first axis X, smaller than the width of the respective body region 10 and a depth, along the third axis Z, smaller than the depth of the respective body region 10.

Each source region 15 laterally delimits, together with the adjacent superficial portion 24, a channel portion 25 of a respective body region 10.

The MOSFET device 1 further comprises a plurality of insulated gate regions 20. The insulated gate regions 20 are formed each by a gate insulating layer 21, in contact with the first surface 5A of the substrate 5; a gate conductive region 22, typically of polycrystalline silicon, directly overlying the gate insulating layer 21; and an insulation layer 23, surrounding and sealing the gate conductive region 22, together with the gate insulating layer 21.

The gate insulating layer 21 of each insulated gate region 20 extends on a respective superficial portion 24 of the drain region 7, on two channel regions 25 adjacent to the respective superficial portion 24, and partially on two source regions 15 adjacent to the respective channel regions 25.

The gate conductive regions 22 have here the shape of strips extending parallel to the second axis Y (see also FIG. 2) and are electrically connected in parallel to each other and to the gate terminal G of the MOSFET device 1, as explained below.

The MOSFET device 1 further comprises a plurality of body contact regions 30.

The body contact regions 30 are of $P^+$ type and extend each from the first surface 5A of the substrate 5 into a respective source region 15, in contact with a respective body region 10. In the shown embodiment, each source region 15 accommodates more than one body contact region 30.

The body contact regions 30 are arranged at a distance to each other along the second axis Y, offset to each other along the first axis X, so that, in the cross-section of FIG. 1, they are visible only in the two source regions 15 on the right and on the left, but not in the central source region 15.

The body contact regions 30 and the source regions 15 are in direct electrical contact with a source metallization region 33, which is, for example, of metal.

As may be noted in particular from FIG. 2, the source metallization region 33 is generally divided into two portions (designated by 33A and 33B in FIG. 2) arranged adjacent and at a distance to each other, which cover the majority of the first surface 5A of the substrate 5. The two portions 33A and 33B of the source metallization region 33 also form pads for external connection of the MOSFET device 1 and form the source terminal S of the MOSFET device 1.

In addition, FIG. 2, two auxiliary source pads 34 and a gate pad 35 also extend on the first surface 5A of the substrate 5. The auxiliary source pads 34, the gate pad 35, and the source metallization region 33 are formed in a same layer and therefore have the same, high thickness so as to provide the desired current capability for the source terminal S.

The gate pad 35 is connected to the gate conductive regions 22 (represented dashed in FIG. 2) through metal connection portions and a resistive network.

In detail, the metal connection portions are formed in the same metal layer as the pads 33, 34 and 35 and comprise a gate metal ring 38A and a gate metal strip or "finger" 38B.

In the embodiment shown in FIG. 2, the gate pad 35 is arranged in proximity of a side of the die 2, in a median position thereof; the gate metal finger 38B extends from the gate pad 35 towards the opposite side of the die 2; and the gate metal ring 38A extends peripherally to the die 2, in electrical contact with, and as an extension of, the gate pad 35.

In particular, in the top view of FIG. 2, the die 2 has a rectangular shape having a first side 2A; a second side 2B, opposite the first side 2A; a third side 2C; and a fourth side 2D, opposite the third side 2C, wherein the third and fourth sides 2C, 2D extend parallel to the first axis X, and the first and second sides 2A, 2B extend parallel to the second axis Y.

In this geometry, the gate pad 35 is arranged in proximity of the first side 2A, the gate metal finger 38B extends parallel to the first axis X from the gate pad 35 to the portion of the gate metal ring 38A adjacent the second side 2B, and the gate conductive regions 22 extend parallel to the second axis Y.

The resistive network comprises a first and a second connection portion 36A, 38B connected to the gate conductive regions 22 and to the metal connection portions 38B, 38A, as described hereinafter and shown in FIGS. 3 and 4, where, for simplicity, the gate insulating layer 21 is not represented.

In particular, FIG. 3 shows a peripheral edge portion (designated by 37) of the die 2, for example adjacent to the fourth side 2D.

An insulation oxide annular portion 40A, for example of silicon oxide, extends over the first surface 5A of the substrate 5 and is covered by a passivation layer 42, connected to the insulation layer 23.

A delimitation region 41, having an opposite conductivity with respect to the substrate 5, here of P type, and having an annular shape, extends within the substrate 5, approximately underneath the inner edge of the insulation oxide annular portion 40A. The delimitation region 41 surrounds, in the substrate 5, an active area 44 (the limit whereof is represented schematically by a dashed line A); accommodating the conduction regions of the MOSFET device 1, including the source regions 15 and the body regions 10 (not visible in FIG. 3). An implanted region 43, here of $N^+$ type and ring-shaped, forming a channel stopper, extends underneath the insulation oxide annular portion 40A, in proximity of the outer edge thereof and of the sides 2A-2D of the die 2, at a distance D from the delimitation region 41.

The first connection portion 36A, of polycrystalline silicon, extends as a ring over and along the inner edge of the insulation oxide annular portion 40A. The first connection portion 36A is here in direct electrical contact with a gate conductive region 22, without interruption, being obtained in the same layer.

FIG. 3 moreover shows the gate metal ring 38A, which extends above the insulation oxide annular portion 40A; the gate metal ring 38A crosses the passivation layer 42 and is here in direct electrical contact with the first connection portion 36A.

Figure 4:
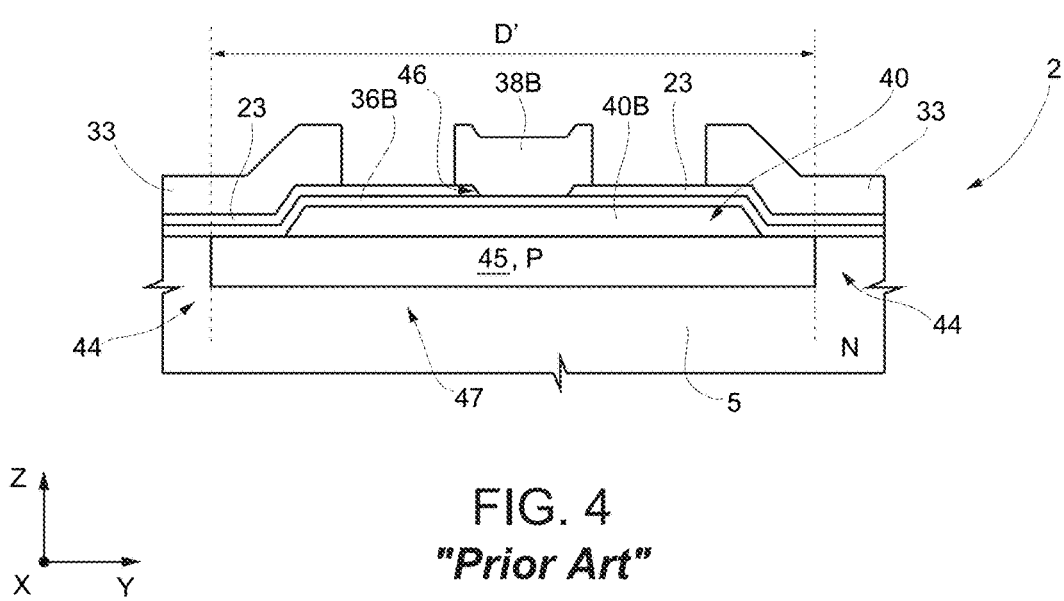
FIG. 4 is a cross-section through the MOSFET device of FIG. 1, taken along section line IV-IV of FIG. 2.

FIG. 4 shows the connection between the gate metal finger 38B and the gate conductive regions 22.

In detail, an insulation oxide finger portion 40B, formed by the same layer as the insulation oxide annular portion 40A, extends over the body 5, parallel to the first direction X, as far as and in contact with the sides of the insulation oxide annular portion 40A adjacent to the first and second sides 2A, 2B of the die 2. The insulation oxide finger portion 40B and the insulation oxide annular portion 40A form an edge insulation region 40.

The second connection portion 36B extends over the insulation oxide finger portion 40B and also has an elongated shape in the first direction X. However, the second connection portion 36B has a width (in a direction parallel to the second direction Y) greater than the width (in the same direction) of the insulation oxide finger portion 40B and therefore extends also on the side of the insulation oxide finger portion 40B, where it is directly connected to the gate conductive regions 22. Moreover, it is directly connected, at its longitudinal ends, to the insulation oxide annular portion 40A.

The insulation layer 23 covers the second connection portion 36B and has an opening 46 extending parallel to the first direction X, approximately throughout the length of the second connection portion 36B. The gate metal finger 38B extends through the opening 46 and is here in direct electrical contact with the second connection portion 36B.

The insulation oxide finger portion 40B extends on an insulation finger region 45, of P type, formed in the body 5 and extending parallel to the first direction X, between two opposite sides of the delimitation region 41, with which it is in direct contact.

The insulation oxide finger portion 40B overlies an inactive area 47 (also referred to as central edge area) that separates two active areas 44.

In the example device 1, the gate metal finger 38B and the gate metal ring 38A have the aim of reducing the voltage drop between the gate pad 35 and the gate conductive regions 22 due to the resistivity of the resistive network formed by the connection portions 36A, 36B.

The presence of the metal connection portions 38A, 38B is, however, disadvantageous in certain applications.

In fact, the gate metal finger 38B causes the source metallization to be divided into at least the two portions 33A, 33B (or even more, in devices that, due to their dimensions, have several gate metal fingers 38B). This limits the use of the MOSFET device 1 in power modules that have clips sintered or soldered on the die 2 or need particular, costly and/or cumbersome solutions for contacting the source metallization region 33.

The presence of the gate metal ring 38A in the peripheral edge portion 37 of the die 2 moreover is critical during the reliability assessment of the MOSFET device 1. In particular, innovative reliability tests that verify the switching behavior in high-humidity environments show that the gate metal ring 38A is a weak point of the device.

The metal connection portions 38A, 38B cause a non-negligible encumbrance, both because of their dimensions and due to the minimum safety space to be provided between the portions 33A, 33B of the source metallization region 33 and the gate pad 35.

For instance, with the shown configuration, the gate metal ring 38A is designed to maintain the distance D in FIG. 3 between the channel-stopper region 43 and the delimitation region 41. Furthermore, as shown in FIG. 4, the distance D' between the active areas 44 (areas where the central edge area 47 and the gate metal finger 38B extend) cannot be used for the conduction of the MOSFET device 1 and represents a waste of area.

FIGS. 5-9 show a MOSFET device 50, with vertical conduction, of silicon carbide.

The MOSFET device 50 is formed in a die 52 having a generally parallelepipedal shape, with four lateral surfaces or sides 52A-52D and a top surface 52E. In particular, in the top view of FIG. 5, the die 52 has a first side 52A; a second side 52B, opposite the first side 52A; a third side 52C; and a fourth side 52D, opposite the third side 2C, wherein the third and fourth sides 52C, 52D are parallel to a first axis X of a Cartesian reference system XYZ, and the first and second sides 52A, 52B are parallel to a second axis Y of the Cartesian reference system XYZ.

The MOSFET device 50 comprises a plurality of elementary cells (two shown in FIGS. 6 and 7) adjacent to each other and connected together in parallel. They thus share a source terminal S, a drain terminal D, and a gate terminal G.

Figure 6:
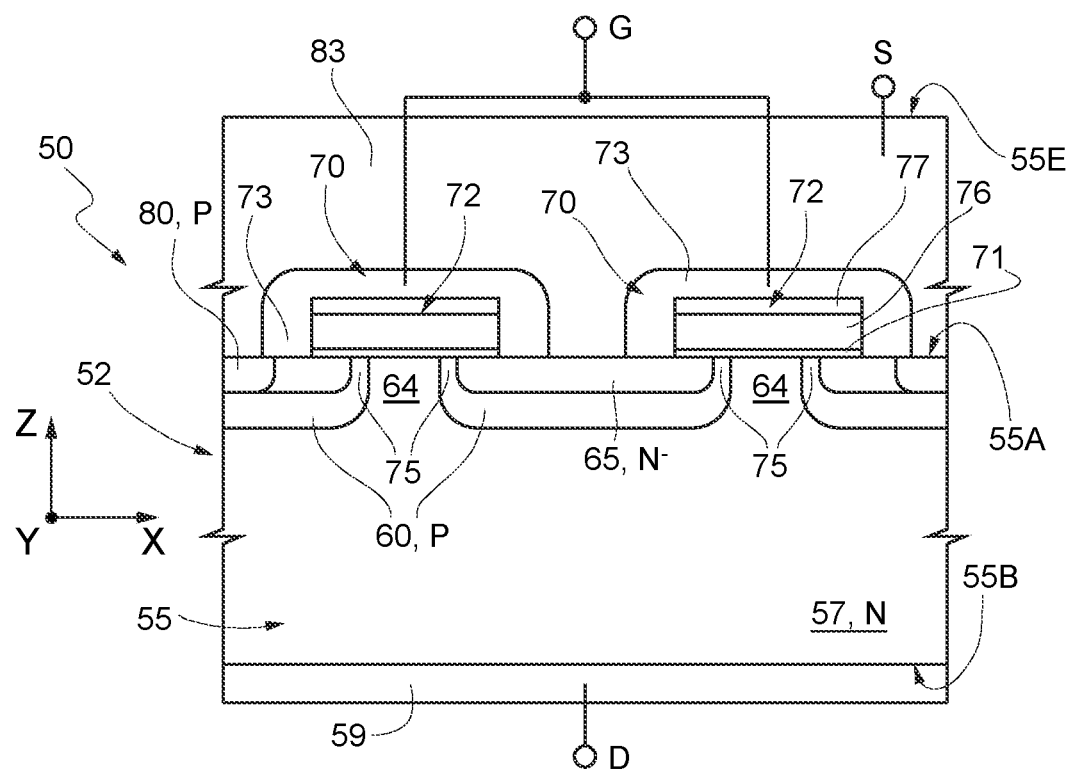
FIG. 6 is a cross-section through the MOSFET device of FIG. 5, taken along section line VI-VI.
Figure 7:
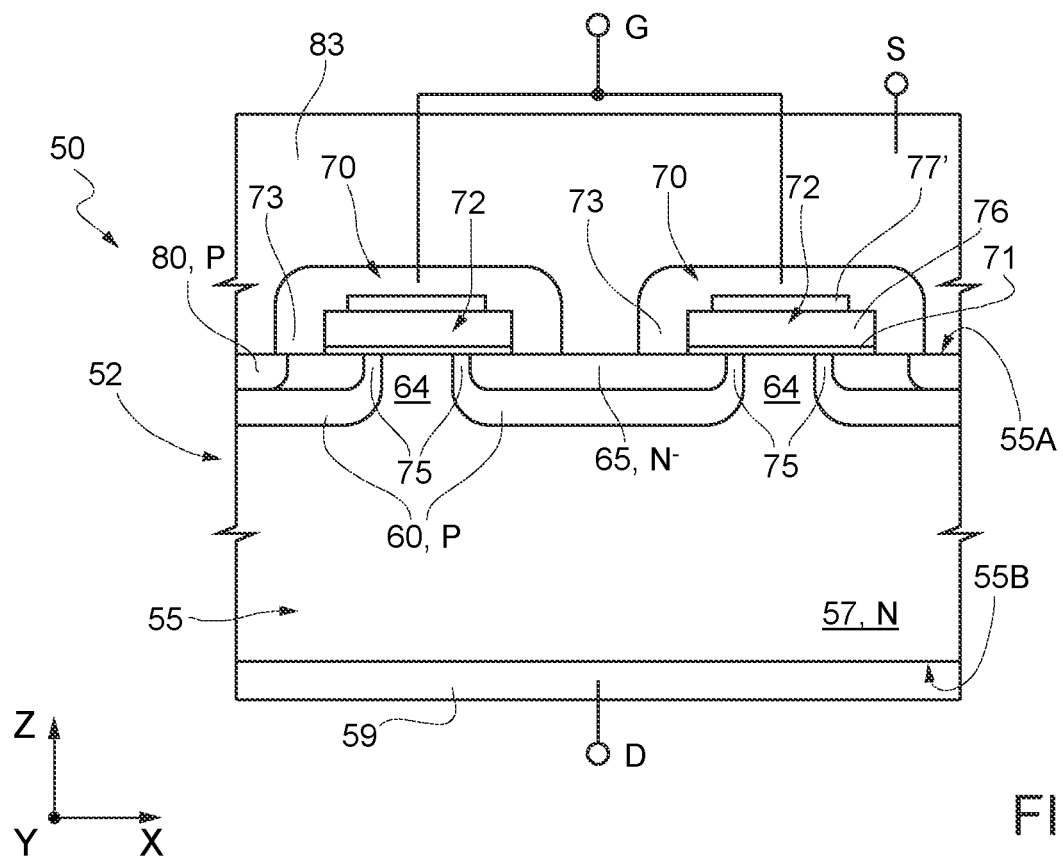
FIG. 7 is a cross-section through the MOSFET device of FIG. 5, taken along section line VI-VI, according to another embodiment.

As may be seen in the cross-sections of FIGS. 6 and 7, the die 52 comprises a substrate 55 of silicon carbide having a first surface 55A and a second surface 55B. The substrate 55 accommodates a drain region 57, a plurality of body regions 60, and a plurality of source regions 65, analogous to the respective same-name regions 7, 10 and 15 of FIG. 1 and not described any further herein.

A drain contact region 59, of conductive material such as a metal and/or a silicide, extends on the second surface 55B of the substrate 55, in direct electrical contact with the drain region 57, and forms the drain terminal D of the MOSFET device 50.

A superficial portion 64 of the drain region 57 is comprised between two adjacent body regions 60.

Each source region 65 laterally delimits, together with an adjacent superficial portion 64, a channel portion 75 of a respective body region 60.

The MOSFET device 50 further comprises a plurality of insulated gate regions 70. The insulated gate regions 70 are each formed by a gate insulating region 71, in some embodiments, in contact with the first surface 55A of substrate 55; a gate conductive region 72, in some embodiments, directly overlying the gate insulating region 71; and a top insulation layer 73, surrounding and sealing, together with the gate insulating region 71, the gate conductive region 72.

Each gate conductive region 72 is here, in some embodiments, formed by a gate semiconductor portion 76, in some embodiments, of polycrystalline silicon, and a gate metal portion 77, directly overlying and in direct electrical contact with the gate semiconductor portion 76. The gate metal portion 77 is, in some embodiments, a metal silicide, for example tungsten, titanium, nickel, cobalt, or platinum silicide.

In the embodiment of FIG. 6, the gate metal portion 77 has the same width (in the direction of the first axis X) as the gate semiconductor portion 76; in the embodiment of FIG. 7, the gate-metal region (designated by 77') has a smaller lateral dimension, e.g., width, than the gate semiconductor portion 76.

The gate insulating region 71 of each insulated gate region 70 extends over a respective superficial portion 64 of the drain region 57, over two channel regions 75 adjacent to the respective superficial portion 64, and partially over two source regions 65 adjacent to the respective channel regions 75.

The gate conductive regions 72 are electrically connected in parallel to one another and to the gate terminal G of the MOSFET device 50, as explained below.

The MOSFET device 50 further comprises a plurality of body contact regions 80 (hereinafter also referred to as P-well regions 80), analogous to the body contact regions 30 of FIG. 1.

The P-well regions 80 and the source regions 65 are in direct electrical contact with a source metallization region 83, for example of metal and/or metal silicide.

In some embodiments, a P-well region 80 is in lateral contact with a source region 65 and in vertical contact with a body 60.

Figure 5:
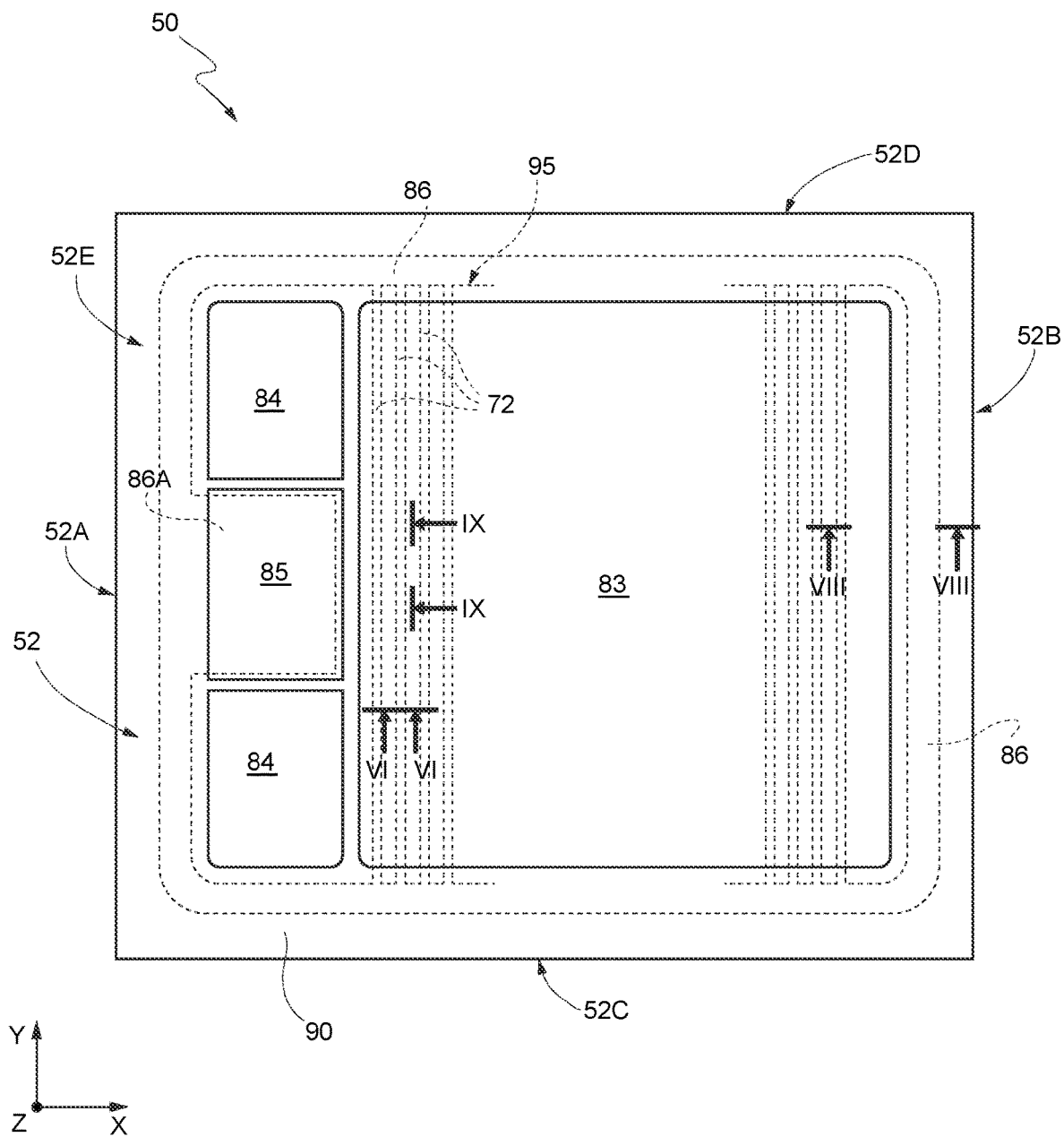
FIG. 5 is a top plan view of the present MOSFET device, according to an embodiment.

As may be noted from FIG. 5, the source metallization region 83 is here formed by a single portion occupying most of the top surface 52E of the die 50 and forms also a pad for external connection of the MOSFET device 50.

In addition, two auxiliary source pads 84 and a gate pad 85 extend on the first surface 55A of the substrate 55. The auxiliary source pads 84, the gate pad 85, and the single source metallization region 83 are formed in a same layer and therefore have the same high thickness, for example comprised between 1 and 10 µm, so as to provide the desired current capability of the source terminal S.

It is highlighted that, if so desired, the source metallization region 83 may be formed by several separate portions, instead of a single portion. In any case, in the MOSFET device 50, the distance between them is not critical, and no gate metal finger (38B in FIG. 1) is present, nor is a gate metal ring (38A in FIG. 1).

The gate pad 85 (here arranged in proximity of the first side 52A of the die 52, in a middle position) is connected to the gate conductive regions 72 (represented dashed in FIG. 5) through an annular connection region 86, which extends in proximity of the periphery of the die 52 and has a widened portion forming a contact area 86A arranged underneath the gate pad 85. The annular connection region 86 is monolithic with the gate conductive regions 72, is formed by the same layers, and is obtained by the same process steps for forming the gate conductive regions 72, as described in detail hereinafter.

Figure 8:
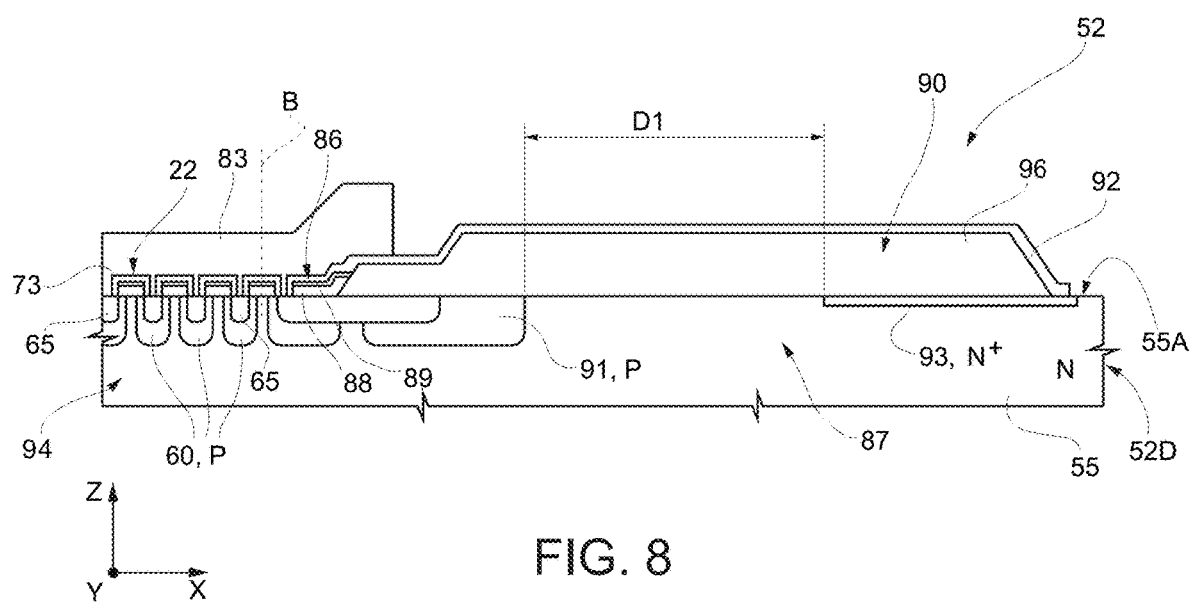
FIG. 8 is a cross-section through the MOSFET device of FIG. 5, taken along section line VIII-VIII.
Figure 9:
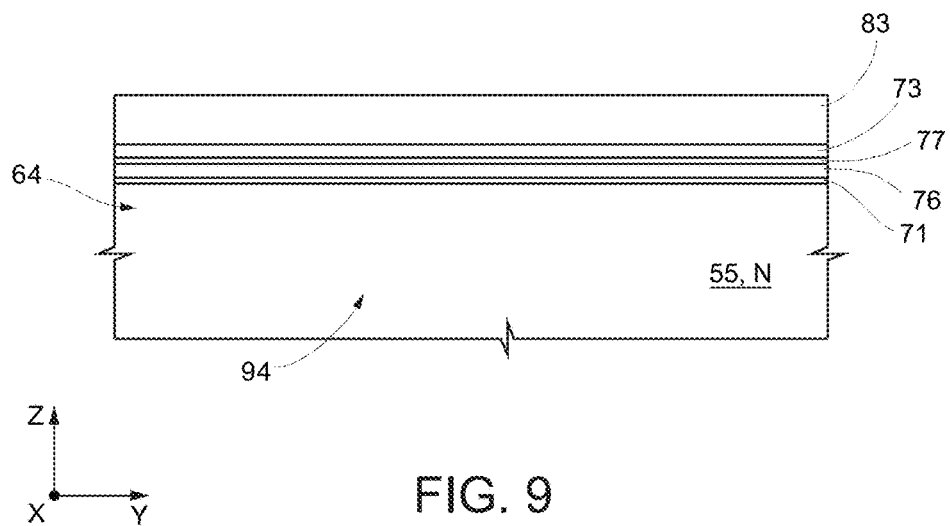
FIG. 9 is a cross-section through the MOSFET device of FIG. 5, taken along section line IX-IX.

The annular connection region 86 is visible also in the cross-sections of FIGS. 8 and 9, wherein, for simplicity, the gate insulating region 71 is not represented.

In particular, FIG. 8 shows a peripheral edge portion (designated by 87), of the die 52, for example adjacent to the second side 52B.

An edge insulation region 90, here of oxide, extends on the first surface 55A of the substrate 55.

The edge insulation region 90 here comprises an oxide layer 96 and a passivation layer 92 overlying the latter. The passivation layer 92, in proximity of the third and the fourth sides 52C, 52D of the die 52, prosecutes with the top insulation layer 73 of the insulated gate regions 70, which, in the cross-section of FIG. 8, is interrupted by the openings, where the source metallization 83 extends.

A delimitation region 91, having a conductivity opposite that of the substrate 55, here of P type and annular shape, extends in the substrate 55 underneath the edge insulation region 90, in proximity of, but at a distance from, the inner edge of the latter. The delimitation region 91 surrounds, in the substrate 55, an active area 94 (whose limit is represented schematically by a dashed line B), accommodating the conduction regions of the MOSFET device 50, including the body regions 60 and the source regions 65. A channel-stopper region 93, here of N$^+$ type and annular shape, extends underneath the edge insulation region 90, in proximity of the sides 52A-52D of the die 52, at a distance D1 from the delimitation region 91, to balance the potential in the edge area.

The annular connection region 86 extends in an annular way only along the inner edge of the edge insulation region 90 and does not have portions extending between active areas.

As mentioned above, the annular connection region 86 is formed monolithically with the gate conductive regions 72 as a stack of two layers.

In particular, the annular connection region 86 comprises a semiconductor connection portion 88 and a metal connection portion 89, directly overlying and in direct electrical contact with the semiconductor connection portion 88.

Moreover, the material of the semiconductor connection region 88 is the same of the gate semiconductor portions 76 (typically of polycrystalline silicon), and the material of the metal connection portion 89 is the same of the gate metal portions 77 (typically a metal silicide, for example tungsten, titanium, nickel, cobalt, or platinum silicide).

The stack of layers forming the gate semiconductor portions 76 and the annular connection region 86 forms a gate bias layer 95.

As may be noted from FIG. 8, the annular connection region 86 extends only to a minimal extent on the edge insulation region 90 and has a very small width, for example comprised between 10 and 50 µm. In addition, the delimitation region 91 has also a small width (in the first direction X, in the cross-section of FIG. 8), for example comprised between 20 and 50 µm. In this way, the width of the peripheral edge portion 87 is reduced, and it is also possible to accordingly increase the dimensions of the active area 94, for same dimensions of the dice 2-52.

Furthermore, as may be seen from FIG. 9 (analogous to and to be compared with FIG. 4 representing the known MOSFET device 1), in the central area of the MOSFET device 50 no inactive edge area extends, due to the absence of gate metallization portions.

Consequently, in the MOSFET device 50, the passivation layer 92/73 completely covers the metal connection portion 89 of the annular connection region 86 at the top, and there are no openings or conductive regions through the passivation layer 92/73, nor are there surface metal portions providing a direct electrical contact between the top surface of the annular connection region 86 and the gate metallization 85. Biasing of the annular connection region 86 occurs in fact only at its portions contiguous with the contact area 86A.

The MOSFET device 50 thus has a wide active area 94 and therefore effectively exploits the area of the die 52.

Figure 10:
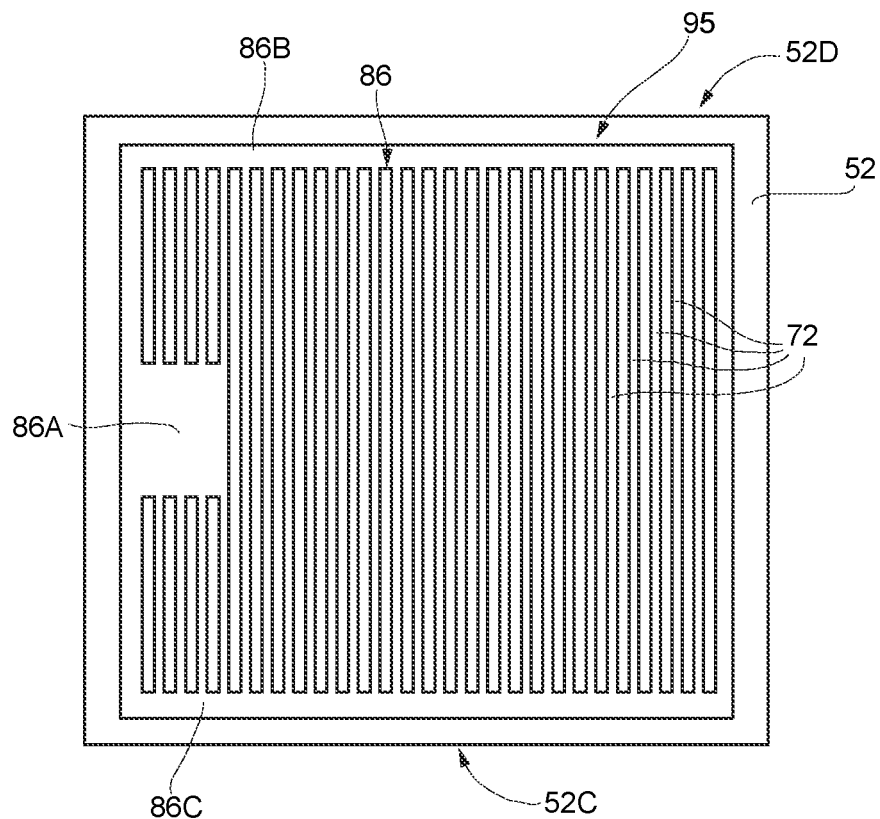
FIG. 10 shows a possible layout of the gate conductive region of the MOSFET device of FIG. 5.
Figure 11:
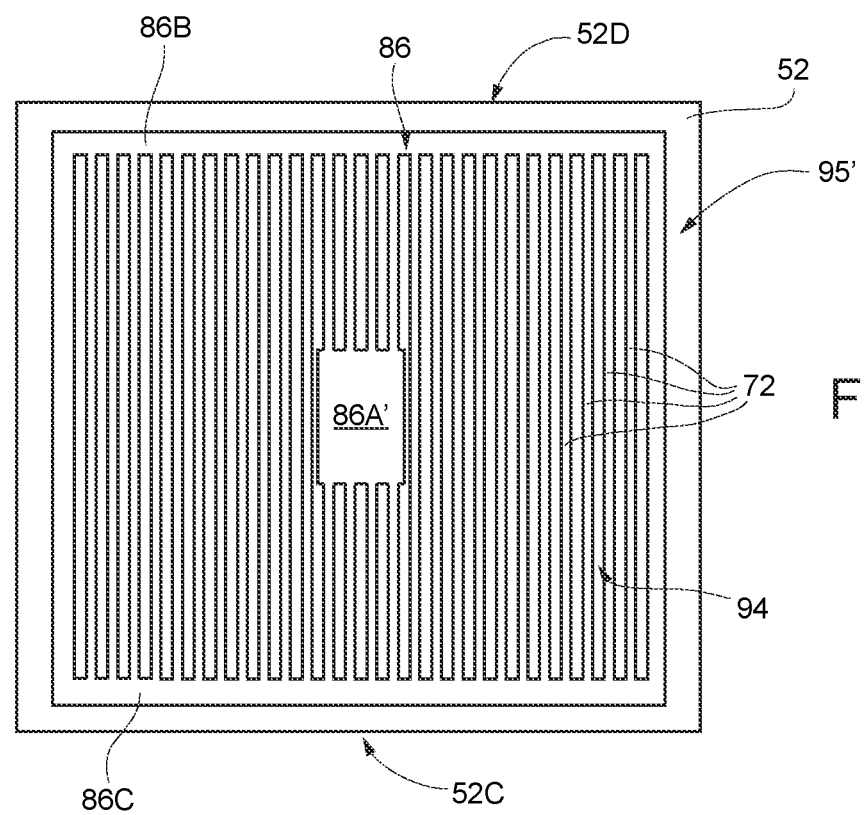
FIG. 11 shows another possible layout of the gate conductive region of the MOSFET device of FIG. 5.

FIGS. 10 and 11 show two possible layouts of the gate bias layer 95.

In particular, FIG. 10 shows the layout of the gate bias layer 95 corresponding to what is shown in FIG. 5, with the contact area 86A arranged peripherally.

As may be noted, the annular connection region 86 has a first and a second branch 86B, 86C, which extend along and in proximity of two opposite sides of the body 52 (and precisely, in the embodiment shown in FIG. 10, along the third and fourth sides 52C, 52D of the die 52), and the gate conductive regions 72 extend continuously between the first and second branches 86B, 86C of the annular connection region 86.

FIG. 11 shows a different layout of the gate bias layer, here designated by 95'.

Also here, the gate conductive regions 72 extend continuously between the first and second branches 86B, 86C of the annular connection region 86. The gate conductive regions 72 arranged most centrally have a widened central portion which is common to different gate conductive regions 72 and forms a contact area 86A' on which the gate pad 85 extends.

In this case, biasing of the annular connection region 86 occurs only through the gate conductive regions 72 that connect the annular connection region 86 to the contact area 86A'.

In general, with the MOSFET device 50, the position of the gate pad 85 and therefore of the contact area 86A, 86A' can be chosen with high freedom, according to the applications and possible customer desires.

The MOSFET device 52 of FIGS. 5, 6 and 8-11 may be manufactured by depositing/forming a silicide layer before or after defining the gate semiconductor portions 76 of the gate conductive regions 72.

Figure 12A:
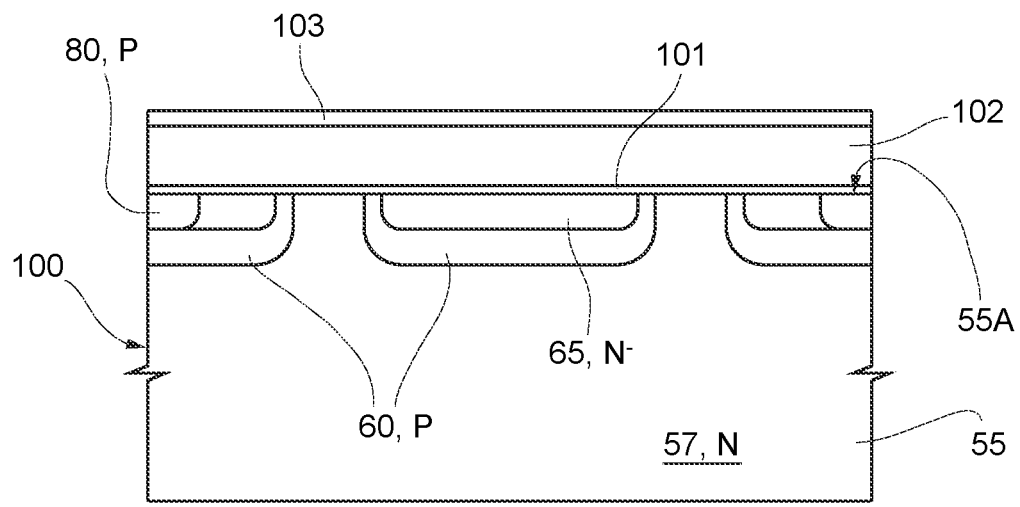
FIGS. 12A-12B are cross-sections (taken in the same section plane as FIG. 6) through a semiconductor wafer in subsequent manufacturing steps of the MOSFET device of FIG. 6, according to an embodiment.

For instance, FIG. 12A shows a wafer 100 of silicon carbide (for example of a 3C—SiC, 4H—SiC or 6H—SiC type) intended to form, after dicing, the die 52 of FIG. 6. In particular, in FIG. 12A, the source regions 65, the body regions 60, and the P-well regions 80 are already formed within the substrate 55, as likewise the various edge regions (including the delimitation region 91 and the channel-stopper region 93 of FIG. 8), here not visible.

A gate insulating layer 101, a gate conductive layer 102, and a silicide layer 103 have already been deposited, in sequence, on the first surface 55A of the substrate 55.

The gate insulating layer 101 is, for example, silicon oxide and is intended to form the gate insulating regions 71.

The gate conductive layer 102 is typically polycrystalline silicon and is designed to form the gate semiconductor portions 76 of the gate conductive regions 72 and the semiconductor connection portion 88.

The silicide layer 103 is, for example, tungsten silicide ($WSi_2$) and is intended to form the gate metal portions 77 and the metal connection portion 89 (FIGS. 6 and 8).

Figure 12B:
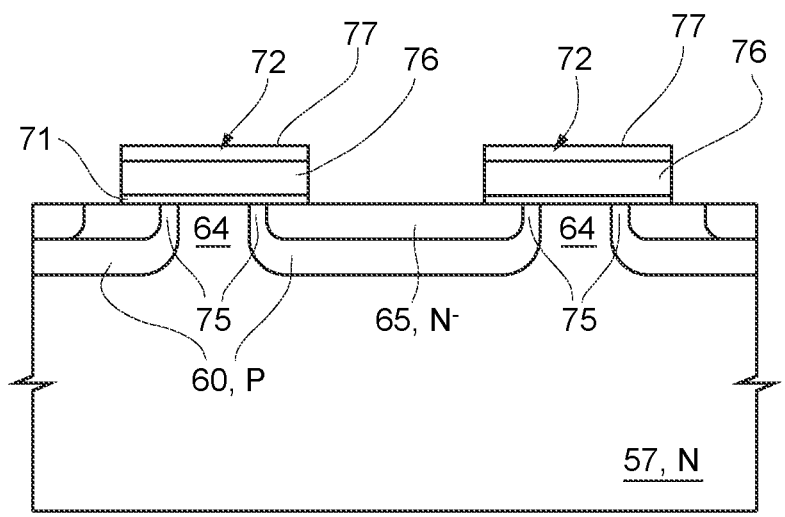

After a stabilization annealing process, for example at a temperature comprised between 700° C. and 1000° C., the silicide layer 103, the gate conductive layer 102, and the gate insulating layer 101 are defined in a known way, by a photolithographic process and using the same etching mask (FIG. 12B).

Thereby, the gate conductive regions 72 (FIGS. 6 and 12B), the annular connection region 86 (FIG. 8) and the gate insulating regions 7 are formed. Furthermore, the gate metal portions 77 and the gate semiconductor portions 76 are self-aligned to each other, as likewise the metal connection portion 89 and the semiconductor connection portion 88.

Then usual steps for forming the top insulation layer 73, the passivation layer 92, and the metallizations 83-85 follow.

In particular, while forming the passivation layer 92, no openings are made for directly contacting the annular connection region 86.

Figure 13A:
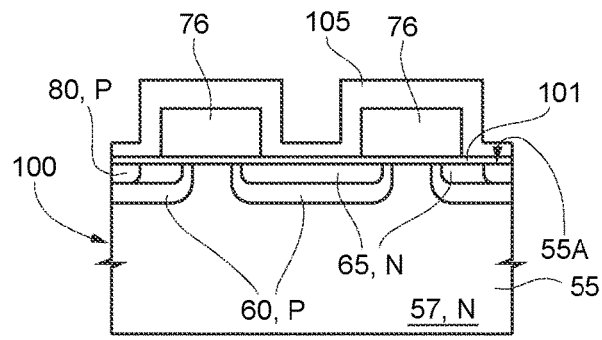
FIGS. 13A-13C are cross-sections (taken in the same section plane as FIG. 6) through a semiconductor wafer in subsequent manufacturing steps of the MOSFET device of FIG. 6, according to a different embodiment.
Figure 13B:
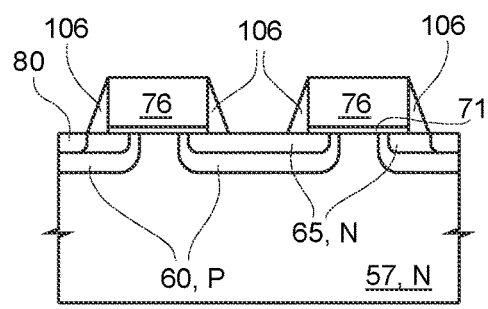
Figure 13C:
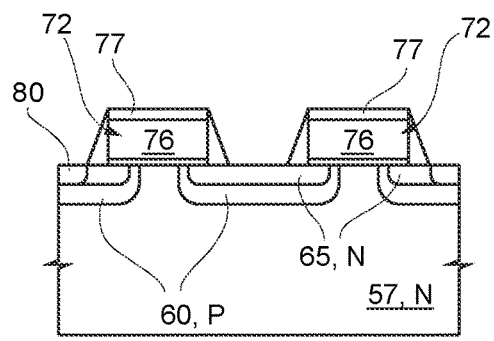

FIGS. 13A-13C show steps of a different embodiment of a manufacturing process of the MOSFET device 50 of FIGS. 5, 6 and 8-11.

In detail, FIG. 13A shows a portion of wafer 100. In the step of FIG. 13A, the source regions 65, the body regions 60, and the P-well regions 80, as well as the various edge regions, have already been formed in the substrate 55.

Moreover, the gate insulating layer 101 has already been deposited on the first surface 55A of the substrate 55, and the gate semiconductor portions 76 of the gate conductive regions 72, as well as the semiconductor connection portion 88, have already been formed, for example by depositing and photolithographically defining a polycrystalline silicon layer.

A sacrificial layer 105, for example, of silicon oxide, is deposited on the gate semiconductor portions 76 and on the gate insulating layer 101, where exposed.

Then (FIG. 13B), the sacrificial layer 105 is etched to form spacers 106 (spacer etching). To this end, etching is of a non-masked, dry, directional type (plasma etching). Due to the etch anisotropy, the horizontal portions of the sacrificial layer 105 are removed, and the spacers 106 are formed on the vertical walls of the gate semiconductor portions 76. In this step, also the portions of the gate insulating layer 101 not covered by the gate semiconductor portions 76 and by the spacers 106, on the source regions 65, are eliminated, forming the gate insulating regions 71.

Similar spacers (not shown) form on the lateral surfaces of the semiconductor connection portion 88 (FIG. 8).

Next (FIG. 13C), a metal layer (for example, titanium or nickel) is deposited by sputtering and reacts with the polycrystalline silicon of the gate semiconductor portions 76 and (in a way not shown) of the semiconductor connection portion 88 (FIG. 8). To this end, a first annealing is carried out at a low temperature, for example comprised 600° C. and 1000° C.

Then, the non-reacted metal material (for example, on the spacers 106) is removed, and a second annealing is carried out at a higher temperature, for example comprised between 800° C. and 1100° C.

The gate metal portions 77 of the gate conductive regions 72 and the metal connection portion 89 of the annular connection region 86 (FIG. 8) are thus formed.

Consequently, also in this case, then, the gate metal portions 77 are self-aligned with the respective gate semiconductor portions 76, and the metal connection portion 89 is self-aligned with the semiconductor connection portion 88.

In this step, a thin silicide layer may form on the exposed portions of the substrate 55, in particular on the source regions 65 and on the P-well regions 80; these portions may be removed by an appropriate etch or left, according to the specific process.

The process proceeds with the usual steps for forming the top insulation layer 73, the passivation layer 92, and the metallizations 83-85.

Figure 14A:
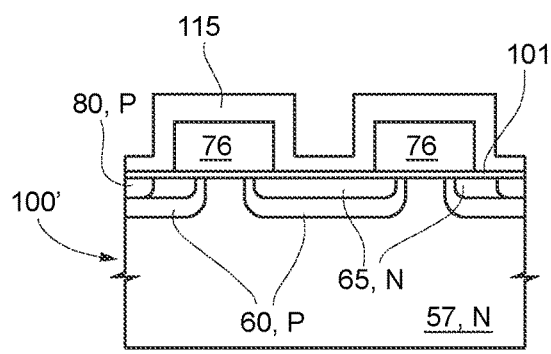
FIGS. 14A and 14B are cross-sections (taken in the same section plane as FIG. 7) through a semiconductor wafer in subsequent manufacturing steps of the MOSFET device of FIG. 7, according to an embodiment.
Figure 14B:
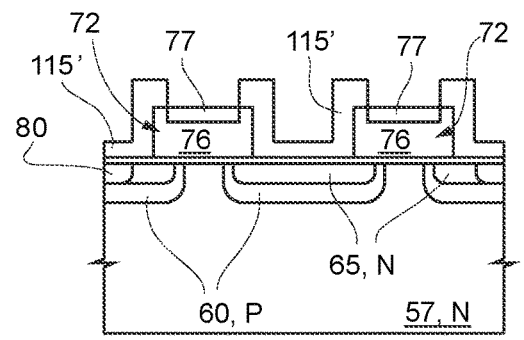

FIGS. 14A-14B show steps of an embodiment of a process for manufacturing the MOSFET device 50 of FIGS. 5, 7 and 8-11.

In particular, FIG. 14A shows a wafer 100' after performing the manufacturing steps already described for FIG. 13A.

In particular, in the wafer 100', the source regions 65, the body regions 60, and the P-well regions 80, as well as the various edge regions, have already been formed in the substrate 55.

The gate insulating layer 101 has already been deposited on the first surface 55A of the substrate 55.

The gate semiconductor portions 76 of the gate conductive regions 72, as well as the semiconductor connection portion 88 (not visible in FIG. 14A) have already been formed, for example by depositing and photolithographically defining a polycrystalline silicon layer.

A sacrificial layer 115, for example, silicon oxide, has been deposited on the gate semiconductor portions 76 and on the gate insulating layer 101, where exposed.

Then (FIG. 14B), a gate contact mask (not shown) is formed on the sacrificial layer 115, and the sacrificial layer 115 is selectively removed on the gate semiconductor portions 76 and on the semiconductor connection portion 88 (not visible in FIG. 14B). Masking portions 115' covering the sides and the longitudinal edges of the gate semiconductor portions 76 and of the semiconductor connection portion 88, as well as the gate insulating layer 101, where exposed, are thus formed.

Then, a metal layer (for example, of titanium, cobalt, or platinum) is deposited by sputtering and caused to react with the polycrystalline silicon of the gate semiconductor portions 76 and (in a way not shown) of the semiconductor connection portion 88 (FIG. 8). To this end, a first annealing at low temperature, for example comprised between 600° C. and 1000° C., is carried out.

Then, the non-reacted metal material (on the masking portions 115') is removed, and a second annealing is carried out at a higher temperature, for example comprised between 800° C. and 1100° C.

The gate metal portions 77 of the gate conductive regions 72 and the metal connection portion 89 of the annular connection region 86 are thus formed (FIG. 8).

Next, the remaining, non-reacted, portions of the sacrificial layer 105 are removed, and the further steps for forming the top insulation layer 73, the passivation layer 92, and the metallizations 83-85 are carried out.

The MOSFET device 50 thus formed has many advantages.

In particular, it has a simplified structure, with increase of the active area, thanks to the size reduction of the peripheral edge areas and elimination of the inner edge area.

The MOSFET device 50 has an improved gate resistance Rg, since it has no waste of area due to the metal connection portions.

The MOSFET device 50 moreover has excellent robustness and may be used also in high-current and/or high-voltage applications. For instance, it is able to work at voltages up to 10 kV or currents up to 500 A.

The MOSFET device 50 has improved reliability because the structure is simplified and the polysilicon of the gate semiconductor portions 76 does not require a particular doping. Consequently, there is no precipitation of dopant (typically, phosphorus) from the gate conductive regions 72 into the gate insulating region 71. In this way, the latter region, typically of oxide, presents a high reliability.

Since, in MOSFET devices that use silicon carbide substrates, all the junctions, implanted regions, and enriched contact regions are activated before forming the layers and regions on the surface of the substrate 55, the process has a low thermal budget after forming the silicide portions 77, 89; consequently, these portions have excellent thermal stability.

In addition, the external contact structures (clips) that are brought into contact with the source metallization 83 during assembly and packaging of the MOSFET device 50 may be simplified, reducing costs and improving the current conduction reliability.

Finally, it is clear that modifications and variations may be made to the MOSFET device and to the manufacturing process described and shown herein, without thereby departing from the scope of the present disclosure, as defined in the attached claims.

For instance, in the embodiment of the process of FIGS. 12A-12B, the silicide layer 103 may be obtained by reacting a metal layer deposited on the gate conductive layer 102.

A vertical-conduction MOSFET device may be summarized as including: a body of silicon carbide having a first and a second face and a peripheral zone, the body accommodating: a first current conduction region, of a first conductivity type, extending in the body from the second face and having a superficial portion facing the first face; a body region, of a second conductivity type, extending in the body from the first face; and a second current conduction region, of the first conductivity type, extending to the inside of the body region from the first face of the body, the second current conduction region delimiting in the body region, together with the superficial portion, a channel portion; an insulated gate region, extending on the first face of the body and overlying the channel portion, the insulated gate region including a gate conductive region; and a surface edge structure, extending on the first face of the body, in the peripheral zone of the body, the surface edge structure including an annular connection region, of conductive material, wherein the gate conductive region and the annular connection region are formed by a gate bias layer including a silicon layer and a metal silicide layer overlying the silicon layer.

The silicon layer may be a polycrystalline layer.

The metal silicide layer may be selected from tungsten, titanium, nickel, cobalt, or platinum silicide.

The gate conductive region may include a gate semiconductor portion formed by the silicon layer and a gate metal portion formed by the metal silicide layer, and the annular connection region may include a semiconductor connection portion formed by the silicon layer and a metal connection portion formed by the metal silicide layer.

The surface edge structure may include a passivation layer completely covering the metal connection portion of the annular connection region.

The gate semiconductor portion may have a first width, the gate metal portion may have a second width, the semiconductor connection portion may have a third width, and the metal connection portion may have a fourth width, wherein the first width is equal to the second width and the third width may be equal to the fourth width.

The gate semiconductor portion may have a first width, the gate metal portion may have a second width, the semiconductor connection portion may have a third width, and the metal connection portion may have a fourth width, wherein the first width may be greater than the second width and the third width may be greater than the fourth width.

The first face of the body has an area and a central portion, the vertical-conduction MOSFET device may further include a conduction contact metal region extending on the first face of the body in direct electrical contact with the second current conduction region, the conduction contact metal region may include a single contact portion covering most of the area of the first face and extending without interruption over the central portion of the first face.

The body may have two opposite lateral surfaces, the annular connection region may have a first and a second branch extending near the opposite lateral surfaces of the body, and the gate conductive region may extend with continuity between the first and second branches of the annular connection region.

A process for manufacturing a vertical-conduction MOSFET device according to claim 1, may be summarized as including: in a body of silicon carbide having a first and a second face and a peripheral zone and accommodating a first current conduction region of a first conductivity type, extending in the body from the second face and having a superficial portion facing the first face, forming a body region, of a second conductivity type extending in the body from the second face; in the body region, forming a second current conduction region, of the first conductivity type, extending from the first face of the body, the second current conduction region delimiting in the body region, together with the superficial portion, a channel portion; forming an insulated gate region on the first face of the body, in a position overlying the channel portion, the insulated gate region including a gate conductive region; and forming a surface edge structure extending on the first face of the body, on the peripheral zone of the body, the surface edge structure including an annular connection region of conductive material, wherein forming the gate conductive region and forming the annular connection region including forming a gate bias layer including a silicon layer and a metal silicide layer overlying the silicon layer.

Forming a gate bias layer may include: depositing the silicon layer on the first face of the body; forming the metal silicide layer on the silicon layer; and photolithographically defining the silicon layer and the metal silicide layer, thereby forming the gate conductive region and the annular connection region.

Forming a gate bias layer may include: depositing the silicon layer on the first face of the body; photolithographically defining the silicon layer to form a gate semiconductor portion and a semiconductor connection portion, the gate semiconductor portion and the semiconductor connection portion having lateral surfaces; forming spacers on the lateral surfaces; depositing a metal layer in direct contact with the gate semiconductor portion and with the semiconductor connection portion; and reacting the metal layer, thus obtaining a gate metal portion in contact with the gate semiconductor portion, and a metal connection portion in contact with the semiconductor connection portion.

Forming a gate bias layer may include: depositing the silicon layer on the first face of the body; photolithographically defining the silicon layer to form a gate semiconductor portion and a semiconductor connection portion, the gate semiconductor portion and the semiconductor connection portion having lateral surfaces and longitudinal edges; forming masking portions covering the lateral surfaces and the longitudinal edges of the gate semiconductor portions and of the semiconductor connection portion; depositing a metal reaction layer in direct contact with the gate semiconductor portion and with the semiconductor connection portion, where exposed by the masking portions; and reacting the metal reaction layer, thus obtaining a gate metal portion in contact with the gate semiconductor portion, and a metal connection portion in contact with the semiconductor connection portion.

Reacting the metal reaction layer may include performing an annealing and may further include removing non-reacted portions of the metal reaction layer.

The silicon layer is polycrystalline silicon, and the metal reaction layer may be selected from tungsten, titanium, nickel, cobalt, and platinum.

The annular connection region may include a semiconductor connection portion formed by the silicon layer, and a metal connection portion formed by the metal silicide layer, and the process may further include depositing a passivation layer completely covering the metal connection portion of the annular connection region.

The various embodiments described above can be combined to provide further embodiments. Aspects of the embodiments can be modified, if necessary to employ concepts of the various embodiments to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A vertical-conduction MOSFET device comprising:
a body of silicon carbide having a first and a second face and a peripheral zone, the body including:
a first current conduction region, of a first conductivity type, extending in the body from the second face and having a superficial portion facing the first face;
a body region, of a second conductivity type, extending in the body from the first face; and
a second current conduction region, of the first conductivity type, extending to an inside of the body region from the first face of the body;
an insulated gate region, extending on the first face of the body and overlying a portion of the body region laterally between the first current conduction region and the second current conduction region, the insulated gate region comprising a gate conductive region; and
a surface edge structure, extending on the first face of the body, in the peripheral zone of the body, the surface edge structure including an oxide layer, a passivation layer, and an annular connection region, of a conductive material,
wherein the gate conductive region and the annular connection region each including a silicon layer and a metal silicide layer overlying the silicon layer,
the gate conductive region includes a gate semiconductor portion including the silicon layer and a gate metal portion including the metal silicide layer,
the annular connection region includes a semiconductor connection portion including the silicon layer and a metal connection portion including the metal silicide layer,
first portions of the semiconductor connection portion and the metal connection portion extend on the first face of the body, and second portions of the semiconductor connection portion and the metal connection portion are spaced from the first face of the body by the oxide layer, and
the passivation layer is on the first portions and the second portions of the semiconductor connection portion and the metal connection portion.

2. The vertical-conduction MOSFET device according to claim 1, wherein the silicon layer is a polycrystalline layer.

3. The vertical-conduction MOSFET device according to claim 1, wherein the metal silicide layer is one or more of tungsten, titanium, nickel, cobalt, or platinum silicide.

4. The vertical-conduction MOSFET device according to claim 1, wherein the gate semiconductor portion has a first width, the gate metal portion has a second width, first width equal to the second width.

5. The vertical-conduction MOSFET device according to claim 1, wherein the gate semiconductor portion has a first width, the gate metal portion has a second width, the first width greater than the second width.

6. The vertical-conduction MOSFET device according to claim 1, wherein the first face of the body has an area and a central portion, the vertical-conduction MOSFET device further comprising a conduction contact metal region extending on the first face of the body in direct electrical contact with the second current conduction region, the conduction contact metal region comprising a single contact portion covering most of the area of the first face including the central portion and extending without interruption over the central portion of the first face.

7. The vertical-conduction MOSFET device according to claim 1, wherein the body has two opposite lateral surfaces, the annular connection region has a first and a second branch extending near the opposite lateral surfaces of the body, and the gate conductive region extends with continuity between the first and second branches of the annular connection region.

8. A method, comprising:
in a body of silicon carbide having a first and a second face and a peripheral zone and of a first conductivity type, forming a body region, of a second conductivity type extending in the body from the first face;
in the body region, forming a current conduction region, of the first conductivity type, extending from the first face of the body, a first portion of the body region laterally between the current conduction region and the body;
forming a gate bias layer on the first face of the body, the gate bias layer including a silicon layer and a metal silicide layer overlying the silicon layer;

forming an insulated gate region on the first face of the body, in a position overlying the first portion of the body region, the insulated gate region including a gate conductive region formed from the gate bias layer; and forming a surface edge structure extending on the first face of the body, on the peripheral zone of the body, the surface edge structure including an oxide layer, a passivation layer, and an annular connection region formed from the gate bias layer, the annular connection region includes a semiconductor connection portion including the silicon layer and a metal connection portion including the metal silicide layer, first portions of the semiconductor connection portion and the metal connection portion extend on the first face of the body, and second portions of the semiconductor connection portion and the metal connection portion are spaced from the first face of the body by the oxide layer, the passivation layer is on the first portions and the second portions of the semiconductor connection portion and the metal connection portion.

9. The method according to claim 8, wherein the forming the gate bias layer comprises:

depositing the silicon layer on the first face of the body;
forming the metal silicide layer on the silicon layer; and
photolithographically patterning the silicon layer and the metal silicide layer.

10. The method according to claim 8, wherein the forming the gate bias layer comprises:

depositing the silicon layer on the first face of the body;
photolithographically patterning the silicon layer to form a gate semiconductor portion and the semiconductor connection portion, the gate semiconductor portion and the semiconductor connection portion having lateral surfaces;
forming spacers on the lateral surfaces;
depositing a metal layer in direct contact with the gate semiconductor portion and with the semiconductor connection portion; and
obtaining a gate metal portion in contact with the gate semiconductor portion, and the metal connection portion in contact with the semiconductor connection portion by reacting the metal layer.

11. The method according to claim 8, wherein the forming the gate bias layer comprises:

depositing the silicon layer on the first face of the body;
photolithographically patterning the silicon layer to form a gate semiconductor portion and the semiconductor connection portion, the gate semiconductor portion and the semiconductor connection portion having lateral surfaces and longitudinal edges;
forming masking portions covering the lateral surfaces and the longitudinal edges of the gate semiconductor portions and of the semiconductor connection portion;
depositing a metal reaction layer in direct contact with portions of the gate semiconductor portion and with the semiconductor connection portion, which are exposed by the masking portions; and
obtaining a gate metal portion in contact with the gate semiconductor portion, and the metal connection portion in contact with the semiconductor connection portion by reacting the metal reaction layer.

12. The method according to claim 11, wherein the reacting the metal reaction layer comprises:

performing an annealing; and
removing non-reacted portions of the metal reaction layer.

13. The method according to claim 12, wherein the silicon layer is polycrystalline silicon, and the metal reaction layer is one or more of tungsten, titanium, nickel, cobalt, and platinum.

14. The method according to claim 8, wherein the passivation layer completely covers the metal connection portion of the annular connection region.

15. A structure, comprising:

a semiconductor body of a first conductivity type, the semiconductor body having a first surface and second surface opposite to the first surface;
a body region of a second conductivity type extending from the first surface of the semiconductor body into the semiconductor body;
a current conduction region of the first conductivity type, extending from the first surface of the semiconductor body into the body region;
a gate region, extending on the first surface of the semiconductor body and overlying a portion of the body region laterally that is between the semiconductor body and the current conduction region, the gate region having a gate semiconductor portion including a silicon layer and a gate metal portion including a metal layer; and
a surface edge structure, extending on a portion of the first surface outside the gate region and including an oxide layer, a passivation layer, and an annular connection region,
the annular connection region including a semiconductor connection portion including the silicon layer and a metal connection portion including the metal layer,
first portions of the semiconductor connection portion and the metal connection portion extend on the first surface of the semiconductor body, and second portions of the semiconductor connection portion and the metal connection portion are spaced from the first surface of the semiconductor body by the oxide layer, and
the passivation layer is on the first portions and the second portions of the semiconductor connection portion and the metal connection portion.

16. The structure according to claim 15, wherein the silicon layer is a polycrystalline layer.

17. The structure according to claim 15, wherein the metal layer is one or more of tungsten, titanium, nickel, cobalt, or platinum silicide.

18. A method, comprising:

in a body of silicon carbide having a first and a second face and a peripheral zone and of a first conductivity type, forming a body region, of a second conductivity type extending in the body from the first face;
in the body region, forming a current conduction region, of the first conductivity type, extending from the first face of the body, a first portion of the body region laterally between the current conduction region and the body;
forming a gate bias layer on the first face of the body, the gate bias layer including a silicon layer and a metal silicide layer overlying the silicon layer;
forming an insulated gate region on the first face of the body, in a position overlying the first portion of the body region, the insulated gate region including a gate conductive region formed from the gate bias layer; and
forming a surface edge structure extending on the first face of the body, on the peripheral zone of the body, the surface edge structure including an annular connection region formed from the gate bias layer,
the forming the gate bias layer includes:

depositing the silicon layer on the first face of the body;

photolithographically patterning the silicon layer to form a gate semiconductor portion and a semiconductor connection portion, the gate semiconductor portion and the semiconductor connection portion having lateral surfaces and longitudinal edges;

forming masking portions covering the lateral surfaces and the longitudinal edges of the gate semiconductor portions and of the semiconductor connection portion;

depositing a metal reaction layer in direct contact with portions of the gate semiconductor portion and with the semiconductor connection portion, which are exposed by the masking portions; and obtaining a gate metal portion in contact with the gate semiconductor portion, and a metal connection portion in contact with the semiconductor connection portion by reacting the metal reaction layer.

19. The method according to claim 18, wherein the silicon layer is a polycrystalline layer.

20. The method according to claim 18, wherein the metal silicide layer is one or more of tungsten, titanium, nickel, cobalt, or platinum silicide.

* * * * *

UNITED STATES PATENT AND TRADEMARK OFFICE
CERTIFICATE OF CORRECTION

PATENT NO. : 12,249,634 B2  
APPLICATION NO. : 17/669239  
DATED : March 11, 2025  
INVENTOR(S) : Mario Giuseppe Saggio et al.

Page 1 of 1

It is certified that error appears in the above-identified patent and that said Letters Patent is hereby corrected as shown below:

In the Claims

<u>Column 14, Claim 6, Line 45</u>:
"covering most of the area" should read: --covering the area--.

Signed and Sealed this
Sixth Day of May, 2025

Coke Morgan Stewart
*Acting Director of the United States Patent and Trademark Office*